United States Patent
Benzinger et al.

(10) Patent No.: US 6,999,355 B2
(45) Date of Patent: Feb. 14, 2006

(54) CIRCUIT ARRANGEMENT AND METHOD FOR SETTING A VOLTAGE SUPPLY FOR A READ/WRITE AMPLIFIER OF AN INTEGRATED MEMORY

(75) Inventors: Herbert Benzinger, München (DE); Koen Van der Zanden, Heverlee (BE); Stephan Schröder, München (DE); Manfred Pröll, Dorfen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/841,546

(22) Filed: May 10, 2004

(65) Prior Publication Data

US 2004/0233737 A1 Nov. 25, 2004

(30) Foreign Application Priority Data

May 23, 2003 (DE) ................................ 103 23 501

(51) Int. Cl.
*G11C 7/00* (2006.01)
*G11C 7/04* (2006.01)

(52) U.S. Cl. .................. 365/189.09; 365/211; 365/212
(58) Field of Classification Search ........... 365/189.09, 365/226, 211, 212, 205
See application file for complete search history.

(56) References Cited

U.S. PATENT DOCUMENTS

| | | | | |
|---|---|---|---|---|
| 5,257,232 A | * | 10/1993 | Dhong et al. | 365/203 |
| 5,970,007 A | * | 10/1999 | Shiratake | 365/207 |
| 6,037,807 A | * | 3/2000 | Wu et al. | 327/52 |
| 6,084,812 A | * | 7/2000 | Joo | 365/222 |
| 6,597,236 B1 | * | 7/2003 | Ooishi et al. | 327/541 |
| 6,687,175 B1 | * | 2/2004 | Mizuno et al. | 365/203 |
| 6,809,576 B1 | * | 10/2004 | Yamasaki | 327/540 |

* cited by examiner

*Primary Examiner*—Son Mai
(74) *Attorney, Agent, or Firm*—Edell, Shapiro & Finnan, LLC

(57) ABSTRACT

A circuit arrangement for setting a voltage supply for a read/write amplifier of an integrated memory has a first voltage generator circuit for generating a supply voltage for application to the read/write amplifier during an assessment and amplification operation and a second voltage generator circuit for generating a precharge voltage for precharging bit lines of the memory which are connected to the read/write amplifier. A temperature detector circuit, which is connected to the first voltage generator circuit, is used to detect a temperature of the memory and interacts with the first voltage generator circuit to set the supply voltage applied to the read/write amplifier in a manner depending on a temperature of the memory.

4 Claims, 1 Drawing Sheet

CIRCUIT ARRANGEMENT AND METHOD FOR SETTING A VOLTAGE SUPPLY FOR A READ/WRITE AMPLIFIER OF AN INTEGRATED MEMORY

CROSS REFERENCE TO RELATED APPLICATIONS

This application claims priority under 35 USC §119(e) to German Application No. 10323501.9, filed on May 23, 2003, and titled "Circuit Arrangement And Method For Setting A Voltage Supply For A Read/Write Amplifier Of An Integrated Memory," the entire contents of which are hereby incorporated by reference.

FIELD OF THE INVENTION

The present invention relates to a circuit arrangement for setting a voltage supply for a read/write amplifier of an integrated memory, which is used to assess and amplify signals stored in memory cells. The circuit arrangement has a first voltage generator circuit for generating a supply voltage for application to the read/write amplifier during an assessment and amplification operation and also a second voltage generator circuit for generating a precharge voltage for precharging bit lines of the memory which are connected to the read/write amplifier. The present invention also relates to a method for setting a voltage supply for a read/write amplifier of an integrated memory.

BACKGROUND

An integrated memory, for instance, DRAM (Dynamic Random Access Memory), generally has a memory cell array including word lines and bit lines. The memory cells, respectively, being arranged at crossover points of the word lines and bit lines. The memory cells which are usually used in integrated dynamic random access memories generally have a memory cell capacitance and a selection transistor. The memory cell capacitances are, respectively connected via the associated selection transistor of the respective memory cell to one of the bit lines via which a data signal is read out or written in. The control input of the selection transistor is connected to one of the word lines.

During a memory access, a word line is first activated. As a result, the memory cells arranged along a word line are respectively connected up conductively to a bit line via the relevant selection transistor. In this case, the stored charge is divided up in accordance with the memory cell capacitance and bit line capacitance. In accordance with the ratio of these two capacitances, i.e., a transfer ratio, this leads to deflection of the bit line voltage. The read/write amplifier situated at one end of the bit line compares this voltage with the constant voltage on an associated complementary bit line and amplifies the relatively low potential difference between the bit line and the complementary bit line until the bit line has reached the full signal level for a stored logic 1 (corresponding, for example, to a positive supply potential) or the signal level for a logic 0 (corresponding, for example, to a reference potential). At the same time, the inverse signal levels are reached on the associated complementary bit line. A corresponding voltage generator circuit applies a supply voltage to the read/write amplifier for the assessment and amplification operation described in order to set the full signal level.

After the memory cell array has been accessed, the previously selected word lines are deactivated. The bit lines are subsequently put as quickly as possible into a precharge state, proceeding from which a new memory access may be effected. To this end, for each bit line pair, the respective bit line and associated complementary bit line are short-circuited via a precharge circuit and are additionally connected in a high-impedance manner to a precharge voltage of the memory. In order to precharge the bit lines, provision is generally made of a precharge circuit having an associated voltage generator circuit for generating the precharge voltage, which is usually situated at the edge of the memory cell array in the vicinity of the assigned read/write amplifier.

The sensitivity of a read/write amplifier essentially depends on the threshold voltage of the transistors used in the read/write amplifier and on its operating point proceeding from the precharge voltage. In particular, the threshold voltage of CMOS transistors used in the read/write amplifier increases as the memory temperature falls. As the threshold voltage of the transistors in the read/write amplifier increases, correspondingly higher input signal levels for feeding into the read/write amplifier are required for compensation in order to be able to carry out an assessment and amplification operation which is still reliable. On the other hand, when the operating point of the read/write amplifier is higher, the sensitivity of the read/amplifier increases as a result of the precharge voltage being raised.

For example, in a circuit arrangement and a method for setting a bit line precharge voltage in an integrated memory. The bit line precharge voltage is generated by a voltage generator circuit, which is driven by a temperature detector in order to set the precharge voltage in a manner dependent on a memory temperature. The bit line precharge voltage is varied relative to the supply voltage applied to a read/write amplifier during an assessment and amplification operation. When the memory temperature is relatively high, the data retention time for a stored logic 1 is to be improved by reducing the precharge voltage. Setting the precharge voltage relative to the supply voltage of the read/write amplifier can, in practice, give rise to problems since it is necessary to "fight against" the relationship between the precharge voltage and supply voltage (magnitude of the precharge voltage corresponds to half the magnitude of the supply voltage). The relationship naturally arises on account of charge equalization, with the result that the power loss of the memory increases.

SUMMARY

A circuit arrangement and a method for setting a voltage supply for a read/write amplifier of an integrated memory can make it possible for the read/write amplifier to carry out an assessment and amplification operation in a reliable and low-loss manner within a wide temperature range.

In addition to a first voltage generator circuit for generating a supply voltage for application to the read/write amplifier during an assessment and amplification operation, the circuit arrangement can also have a second voltage generator circuit for generating a precharge voltage for precharging bit lines of the memory which are connected to the read/write amplifier. In this case, the second voltage generator circuit can regulate the precharge voltage to a bias value, which behave proportionally to the supply voltage applied to the read/write amplifier. A temperature detector circuit for detecting a memory temperature can be connected to the first voltage generator circuit and can interact with the first voltage generator circuit in order to set the supply voltage (applied to the read/write amplifier) in a manner dependent on a temperature of the memory.

In accordance with the method according to the invention, the temperature detector circuit can detect a temperature change of the integrated memory. The supply voltage for application to the read/write amplifier during an assessment and amplification operation can be generated and set in a manner dependent on the temperature change. The precharge voltage for precharging the bit lines of the memory, which can be connected to the read/write amplifier can be generated and set proportionally to the supply voltage applied to the read/write amplifier.

Low-temperature properties of the read/write amplifier of an integrated memory can be improved since the temperature response of a transistor threshold voltage of transistors used in the read/write amplifier can be compensated for by temperature-dependent tracking of the supply voltage and precharge voltage of the read/write amplifier. In this case, the supply voltage for application to the read/write amplifier is the primary controlled variable. The relationship between the precharge voltage and supply voltage, which naturally arises can be retained.

In particular, as the temperature of the memory falls, a magnitude of the supply voltage to be applied to the read/write amplifier is raised in order to compensate for the varying transistor threshold voltage. To this end, the supply voltage, in particular can be set depending on a temperature of the memory such that a change in the supply voltage behaves proportionally to a temperature-dictated change in a transistor threshold voltage of a transistor used in the read/write amplifier. The difference between the precharge voltage and transistor threshold voltage can be constant in this case.

BRIEF DESCRIPTION OF THE FIGURES

The invention is explained in more detail below with reference to the FIGS. which depict exemplary embodiments of the present invention and are illustrated in the drawing, in which.

DETAILED DESCRIPTION

Figure 1:
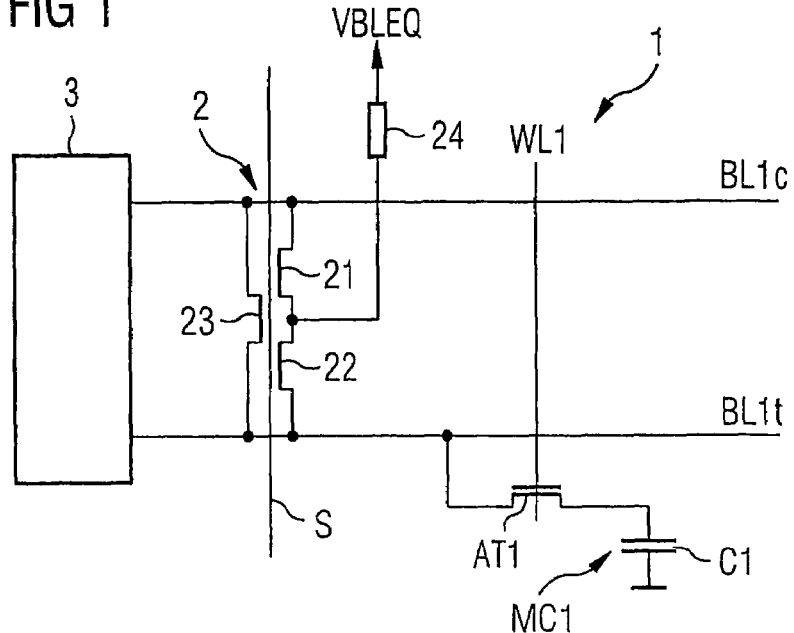
FIG. 1 shows an embodiment of a memory cell array of an integrated memory having a read/write amplifier and a precharge circuit.

FIG. 1 partially illustrates an embodiment of a memory cell array of an integrated memory 1, in which memory cells are respectively arranged at crossover points of word lines and bit lines. In this case, the bit lines can be organized in bit line pairs. The bit lines of a bit line pair can run substantially parallel to one another. In this case, for the sake of clarity, FIG. 1 shows one word line WL1 and one bit line pair including the bit lines BL1c, BL1t. The memory cell MC1, for example, has a selection transistor AT1 and a memory cell capacitor C1. The control input of the selection transistor AT1 can be connected to the word line WL1, which activates the memory cell MC1 in the event of a memory access. To this end, the word line WL1 can turn on the selection transistor AT1. If the selection transistor AT1 is on, the charge stored in the memory cell capacitance C1 may pass onto the bit line BL1t and from there into the read/write amplifier 3.

The memory, shown in FIG. 1, can have a precharge circuit 2, which can be connected to the bit lines BL1c, BL1t. The precharge circuit 2 can be used to precharge these bit lines to a precharge voltage VBLEQ, which can be less than a supply voltage of the memory. The precharge circuit 2 can have the precharge transistors 21 and 22. The controlled paths of the precharge transistors 21 and 22 can be connected to a terminal for the precharge voltage VBLEQ and to one of the bit lines BL1c, BL1t. A transistor 23, i.e., an equalize transistor, can be provided so that the bit lines BL1c, BL1t can be connected to one another, i.e., "equalizing." The precharge transistors 21, 22 and the equalize transistor 23 can be driven via the control line S. The precharge transistors 21, 22 may be connected to the precharge voltage VBLEQ via the resistor 24.

During an operation of reading out a data signal stored in the memory cell MC1, the stored charge can be divided up in accordance with the memory cell capacitance and bit line capacitance. In accordance with the ratio of these two capacitances, this leads to deflection of the bit line voltage of the bit line BL1t. The read/write amplifier 3 can assess this bit line voltage and amplify the relatively low potential difference when reading the memory cell MC1 until the relevant bit line BL1t has reached the full signal level for a stored logic 1 or the signal level for a logic 0. At the same time, the inverse signal levels can be reached on the associated complementary bit line BL1c.

Figure 2:
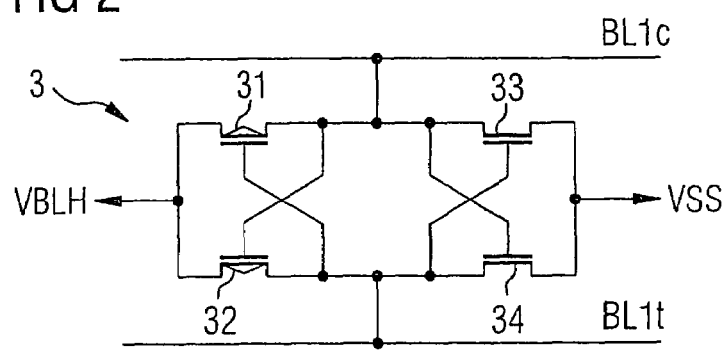
FIG. 2 shows an embodiment of a read/write amplifier of the integrated memory shown in FIG. 1.

An embodiment of a read/write amplifier of the integrated memory shown in FIG. 1 is illustrated in more detail in FIG. 2. In this case, the read/write amplifier 3 can have two amplifier halves including the PMOS transistors 31 and 32 and the NMOS transistors 33 and 34, respectively. During an assessment and amplification operation, the amplifier half having the transistors 31 and 32 can drive that one of the bit lines BL1c, BL1t having the higher potential to the supply voltage VBLH and the amplifier half having the transistors 33 and 34 can drive that one of the bit lines BL1c, BL1t having the lower potential to the reference voltage VSS.

When designing the read/write amplifier 3 shown in FIG. 2, the respective transistor threshold voltages of the transistors 31 to 34 can be matched for an accurate assessment and amplification operation of the relatively small potential swing when reading a memory cell. In particular, the sensitivity of the read/write amplifier can depend on the transistor threshold voltage of the transistors provided in the read/write amplifier and on its operating point proceeding from the precharge voltage VBLEQ. As the memory temperature falls, the threshold voltage of the transistors 31 to 34 can increase. In order to improve the low-temperature properties of the read/write amplifier 3, the temperature response of the transistor threshold voltage of the transistors 31 to 34 can be compensated for in accordance with the invention.

Figure 3:
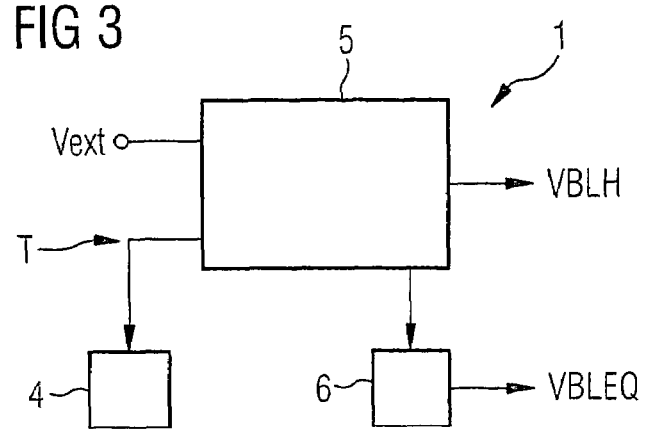
FIG. 3 shows an embodiment of voltage generator circuits interacting with a temperature detector circuit for generating the precharge voltage and supply voltage.

FIG. 3 illustrates an embodiment of voltage generator circuits 5 and 6 interacting with a temperature detector circuit 4 in order to set the supply voltage VBLH and the precharge voltage VBLEQ in a temperature-compensated manner. In this case, the voltage generator circuit 5 can generate, from the external supply voltage Vext, the supply voltage VBLH for application to the read/write amplifier 3 during the assessment and amplification operation. The voltage generator circuit 6 can generate the precharge voltage VBLEQ for precharging the bit lines BL1t, BL1c. In this case, the precharge voltage VBLEQ can be regulated to a bias value which behaves proportionally to the supply voltage VBLH applied to the read/write amplifier 3. To this end, the voltage generator circuit 6 can be, for example, in the form of a voltage divider. In particular, the relationship, which naturally arises during "equalizing" on account of charge equalization, $$VBLEQ = \frac{1}{2} VBLH$$

can be set. A temperature detector circuit 4, which can be used to detect a memory temperature and can forward a temperature reference value T to the voltage generator circuit 5, can be provided. To this end, the temperature detector circuit 4 can be connected to the voltage generator circuit 5 and can interact with the latter such that the supply voltage VBLH applied to the read/write amplifier can be set depending on the temperature of the memory. In particular, the voltage generator circuit 5 can generate the supply voltage VBLH depending on the temperature reference value T in such that a change in the supply voltage VBLH can behave proportionally to a temperature-dictated change in a transistor threshold voltage Vt of one of the transistors 31 to 34 used in the read/write amplifier 3. Since, in accordance with the invention, the precharge voltage VBLEQ can behave proportionally to the supply voltage VBLH, the change in the precharge voltage VBLEQ can also be proportional to the temperature-dictated change in the transistor threshold voltage Vt. In this case, the difference between the precharge voltage VBLEQ and transistor threshold voltage Vt can be constant, i.e., $$VBLEQ(T) - Vt(T) = \text{const.}$$

This means that, as the temperature of the memory falls, the magnitude of the supply voltage VBLH and likewise the magnitude of the precharge voltage VBLEQ can be raised since, as the temperature falls, the transistor threshold voltage of the transistors used in the read/write amplifier can increase.

In contrast thereto, raising the supply voltage VBLH when the temperature is high can also be associated with an increase in leakage currents in the memory cells and thus a reduction in the cell signal stored in the memory cells. In this case, leakage currents increase exponentially as the temperature increases. In this context, the supply voltage VBLH and, proportionally thereto, the precharge voltage VBLEQ, can be raised for relatively low memory temperatures. This means that the operating point of the read/write amplifier can also be raised for low temperatures. The problem with a falling memory temperature is that, as the transistor threshold voltage increases, it becomes increasingly more difficult to read a logic 0, in the case of which the potential of the corresponding bit line is lowered during the read-out operation, since the potential difference between the transistor threshold voltage and the voltage of the bit line to be assessed becomes increasingly smaller.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Integrated memory
2 Precharge circuit
3 Read/write amplifier
4 Temperature detector circuit
5 Voltage generator circuit
6 Voltage generator circuit
21, 22 Precharge transistor
23 Equalize transistor
24 Resistor
31 to 34 Transistor
WL1 Word line
BL1c, BL1t Bit lines
MC1 Memory cell
AT1 Selection transistor
C1 Memory cell capacitance
S Control line
VBLEQ Precharge voltage
VBLH Supply voltage
VSS Reference voltage
Vext External supply voltage
T Temperature reference value

We claim:

1. A circuit arrangement for setting a voltage supply for a read/write amplifier of an integrated memory for assessing and amplifying signals stored in memory cells comprising:
    a first voltage generator circuit that generates a supply voltage for application to the read/write amplifier during an assessment and amplification operation, wherein the first voltage generator circuit generates the supply voltage for application to the read/write amplifier depending on a temperature of the memory such that a change in the supply voltage behaves proportionally to a temperature-dictated change in a transistor threshold voltage of a transistor used in the read/write amplifier and such that a difference between a precharge voltage and the transistor threshold voltage is constant;
    a second voltage generator circuit that generates a precharge voltage for precharging bit lines of the memory which are connected to the read/write amplifier, the second voltage generator circuit regulating the precharge voltage to a bias value which behaves proportionally to the supply voltage applied to the read/write amplifier; and
    a temperature detector circuit for detecting a temperature of the memory, the temperature detector circuit being connected to the first voltage generator circuit and interacting with the first voltage generator circuit to set the supply voltage applied to the read/write amplifier depending on a temperature of the memory.

2. The circuit arrangement as claimed in claim 1, wherein the second voltage generator circuit regulates the precharge voltage to a bias value, a magnitude of the bias value being half the magnitude of the supply voltage applied to the read/write amplifier.

3. A method for setting a voltage supply for a read/write amplifier of an integrated memory for assessing and amplifying signals stored in memory cells, comprising:
    detecting a temperature change of the integrated memory;
    generating and setting of a supply voltage for application to the read/write amplifier during an assessment and amplification operation depending on a temperature change in such a way that a change in the supply voltage behaves proportionally to a temperature-dictated change in a transistor threshold voltage of a transistor used in the read/write amplifier and such that a difference between the precharge voltage and the transistor threshold voltage is constant; and
    generating and setting of a precharge voltage for precharging bit lines of the memory proportionally to the supply voltage applied to the read/write amplifier the bit lines being connected to the read/write amplifier.

4. The method as claimed in claim 3, wherein, as the temperature of the memory falls, a magnitude of the supply voltage for application to the read/write amplifier is raised.

* * * * *